United States Patent [19]
Colleran et al.

[11] Patent Number: 5,579,574
[45] Date of Patent: Dec. 3, 1996

[54] METHOD OF FABRICATING FLAT FLEXIBLE CIRCUITS

[75] Inventors: Stephen A. Colleran, Lisle; Robert M. Fuerst, Maple Park; Fred L. Krehbiel, Chicago, all of Ill.

[73] Assignee: Molex Incorporated, Lisle, Ill.

[21] Appl. No.: 550,420

[22] Filed: Oct. 30, 1995

Related U.S. Application Data

[63] Continuation of Ser. No. 188,496, Jan. 28, 1994.

[51] Int. Cl.$^6$ ........................................ H05K 3/34
[52] U.S. Cl. ................ 29/840; 29/759; 29/832; 228/180.21
[58] Field of Search .............. 29/846, 759, 840; 228/180.21

[56] References Cited

U.S. PATENT DOCUMENTS

| | | | |
|---|---|---|---|
| Re. 32,688 | 6/1988 | Olson | 29/874 |
| 3,535,780 | 10/1970 | Berger . | |
| 3,724,068 | 4/1973 | Galli | 228/180.21 X |
| 3,771,711 | 11/1973 | Lesyk et al. | 228/180.21 X |
| 3,831,252 | 8/1974 | Miller | 228/180.21 X |
| 4,079,309 | 3/1978 | Jackson et al. | 228/180.21 X |
| 4,173,820 | 11/1979 | Frosch et al. . | |
| 4,231,153 | 11/1980 | Browne | 29/759 X |
| 4,236,301 | 12/1980 | Hug et al. | 29/759 X |
| 4,600,256 | 7/1986 | Anttila . | |
| 4,600,971 | 7/1986 | Rose et al. . | |
| 4,667,403 | 5/1987 | Edinger et al. | 29/840 |
| 4,726,638 | 2/1988 | Farrar et al. | 439/620 |
| 4,729,752 | 3/1988 | Dawson, Jr. et al. | 439/620 |
| 4,850,103 | 7/1989 | Takemoto et al. | 29/759 X |
| 5,027,505 | 7/1991 | Nakamura et al. | 29/832 |
| 5,133,118 | 7/1992 | Lindblad et al. | 29/840 |
| 5,141,455 | 8/1992 | Ponn | 439/620 |

FOREIGN PATENT DOCUMENTS

| | | | |
|---|---|---|---|
| 2412225 | 7/1979 | France | H05K 3/02 |
| 2034127 | 5/1980 | United Kingdom | H05K 1/00 |
| 2034527 | 6/1980 | United Kingdom | H05K 1/00 |

*Primary Examiner*—Carl J. Arbes
*Attorney, Agent, or Firm*—A. A. Tirva

[57] ABSTRACT

A method is provided for fabricating flat flexible circuits which include a flat flexible insulating substrate having conductive circuit material thereon and electronic components mounted on the substrate. The method includes providing a continuous strip of the substrate. The strip is moved to a work station whereat the electronic components are mounted thereon. The strip, with the electronic components mounted thereon, is wound onto a reel for subsequent processing. The continuous strip of substrate is provided with a code for reading at the work station.

13 Claims, 3 Drawing Sheets

METHOD OF FABRICATING FLAT FLEXIBLE CIRCUITS

This is a continuation of copending application Ser. No. 08/188,496, filed on Jan. 28, 1994.

FIELD OF THE INVENTION

This invention generally relates to the art of electrical connecting devices and, particularly, to a method of fabricating flat flexible circuits, such as flexible electrical filter assemblies.

BACKGROUND OF THE INVENTION

Flat flexible circuits are used in a wide variety of applications in the electrical connector art. Generally, a flat flexible circuit includes a flat flexible insulating substrate having a conductive circuit thereon. The circuit may be a plurality of circuit traces deposited on the substrate, or the circuit may be a ground plane laminated to the substrate as described below, or other circuitry is imaginable. Electronic components are mounted on the substrate in electrical conductive coupling arrangements with the circuit material.

One application of flat flexible circuits is in shielded or filtered connectors. In other words, there are a variety of electrical connectors which are termed "filter" connectors, in that electronic components, such as capacitors, are coupled between the terminals of the connector and a ground plate or plane normally mounted to a face of a dielectric housing of the connector. The filters are used to suppress electromagnetic interference and radio frequency interference entering the connector system. Flat flexible circuits may be used as the ground planes in such filtered electrical connectors. In such applications, the electronic components, such as the capacitors, are mounted to a flat flexible insulating substrate which eventually becomes the ground plane of the electrical connector. Such assemblies are fabricated to facilitate mass production of electrical connectors, particularly multi-conductor/terminal connectors. An example of such an application of a flat flexible filter circuit is shown in U.S. Pat. No. 5,141,455, dated Aug. 25, 1992 and assigned to the assignee of this invention.

Heretofore, flat flexible circuits have been manufactured primarily as individual flexible circuit panels. In other words, a flat flexible insulating substrate may be provided in a continuous strip form. The conductive circuit material may be deposited on the substrate strip in discrete areas or sections therealong corresponding to the areas which will comprise the individual flexible circuits. Indexing holes or other cut-out areas also may be formed in the continuous substrate strip. After being prepared for receiving electronic components, the strip is cut into individual or discrete sections corresponding to individual flexible circuit panels. Thereafter, the individual flexible circuit panels are fed to a work station, such as an insertion or assembly machine, whereat the electronic components, such as capacitors, are mounted on the panels. During these handling procedures, the flexible panels may be carried in a more rigid frame, such as a metal frame. The frame may have mechanical or optical coding to dictate to an assembly machine what particular operations or circuit component insertions are to be carried out with respect to the carried panel.

Various problems continue to be encountered in fabricating flat flexible circuits according to the procedures outlined immediately above. In particular, the individual flat flexible circuit panels are very difficult to manipulate and handle. That is why they often are mounted in the more rigid carrying frames. The panels, with or without the frames, are difficult to store and/or package. All of these handling procedures for the individual flexible panels create inefficiency in processing and are not cost effective in fabricating the ultimate product of the flat flexible circuits.

The present invention is directed to solving these problems in a method which involves not only the initial use of a continuous strip of flexible substrate material, but the ultimate product, complete with its electronic components, is carried in continuous seriatim form through the processing steps and even stored on a reel for subsequent processing or use.

SUMMARY OF THE INVENTION

An object, therefore, of the invention is to provide a new and improved method of fabricating, storing and transporting flat flexible circuits.

For purposes of the method of the invention, the flat flexible circuit includes a flat flexible insulating substrate having conductive circuit material thereon and electronic components mounted on the substrate. The method includes the steps of providing a continuous strip of the substrate. The strip is moved to a work station whereat the electronic components are mounted thereon. The strip, with the electronic components mounted thereon, then is wound onto a reel for subsequent processing, such as mounting in a filtered electrical connector.

As disclosed herein, the continuous strip of the substrate, with the electronic components mounted thereon, is moved directly from the work station onto the reel. The substrate has conductive material on at least one side thereof, and at least some of the electronic components are capacitors. The method includes mounting the capacitors on the substrate coupled to the conductive material.

The continuous strip of the substrate is provided in a condition with the conductive circuit material thereon; with cuts to divide the strip into discrete circuit panel areas seriatim along the length of the strip; with at least one carrier strip lengthwise thereof and to which the discrete circuit panels are removably attached by web portions of the continuous strip of the substrate; and with a code on the carrier strip for reading at the work station. The code may be mechanical or optical.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
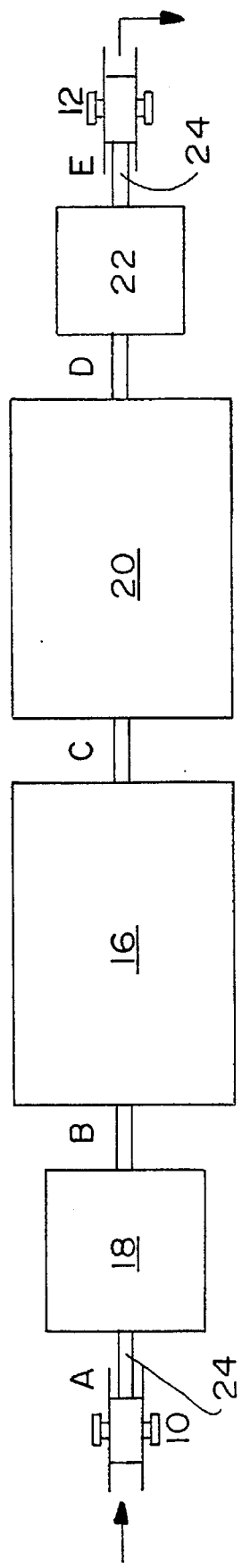
FIG. 1 is a flow diagram illustrating the method of the invention.

Referring to the drawings in greater detail, and first to FIG. 1, the inventive method of fabricating flat flexible circuits is illustrated in a flow diagram which includes a supply reel 10, a take-up or storage reel 12 and a main work station, generally designated 14, between the reels. The main work station includes an electronic component insertion machine 16. Another work station 18 is located between supply reel 10 and main work station 14, and a further work station 20 is located between main work station 14 and take-up reel 12. Lastly, a test station 22 is located between work station 20 and the take-up reel.

Figure 2:
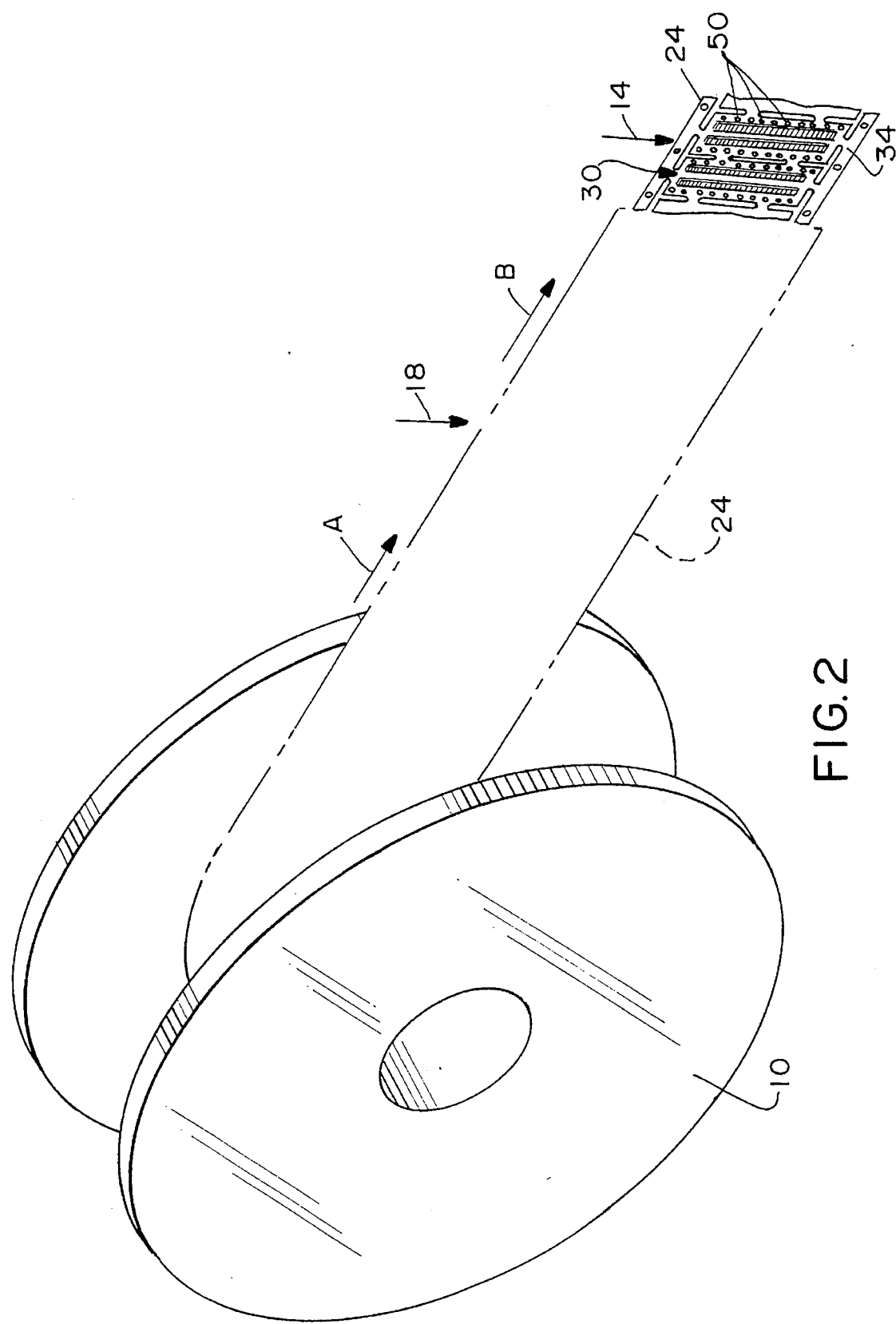
FIG. 2 is a perspective view of the flat flexible insulating substrate strip as it is fed off of a supply reel toward a work station.

Referring to FIG. 2 in conjunction with FIG. 1, supply reel 10 is illustrated with a continuous strip of flat flexible insulating substrate, generally designated 24, wound thereon. The continuous strip of substrate is fed off of the reel in the direction of arrow "A". Work stations 14 and 18 (FIG. 1) are shown by correspondingly numbered arrows 14 and 18 in FIG. 2.

Figure 3:
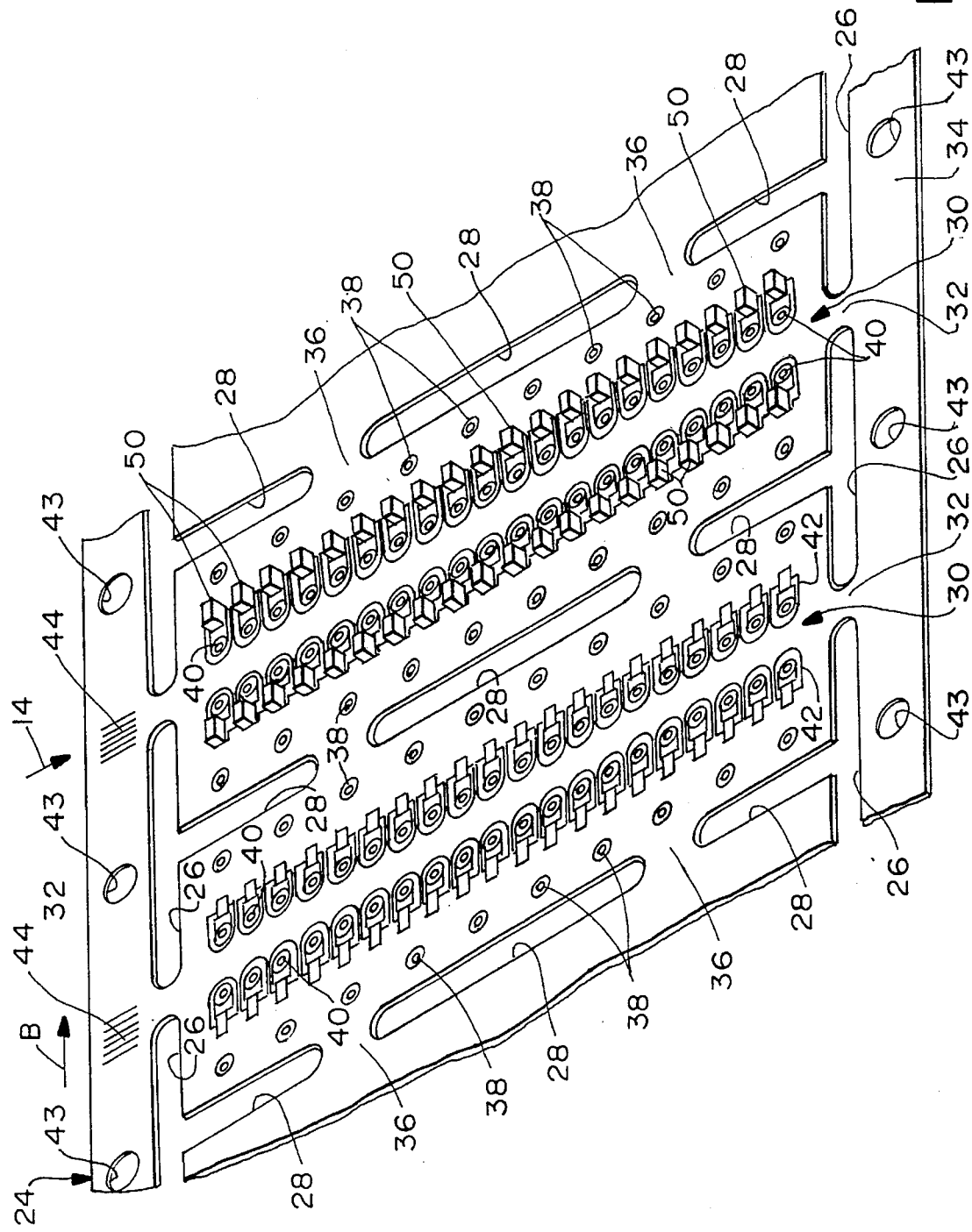
FIG. 3 is fragmented perspective view of a section of the substrate strip with electronic components mounted on one circuit panel area.

Referring to FIG. 3 in conjunction with FIGS. 1 and 2, the continuous strip of substrate 24 is provided with lengthwise cuts 26 and transverse cuts 28 which divide the continuous strip into individual or discrete circuit panel areas, generally designated 30. Each circuit panel area is joined by a web 32 at each opposite side to a pair of continuous carrier strips 34 running lengthwise of the continuous strip of substrate 24. Transverse cuts 28 also form webs 36 therebetween. Therefore, in ultimate use, webs 32 and 36 will be cut to form individual flat flexible circuits.

Product may also be manufactured without any cuts and have the entire perimeter cut when it is singulated for ultimate use.

Still further, the continuous strip of substrate 24 is provided on supply reel 10 with a plurality of holes 38 and another plurality of holes 40. Holes 38 are provided for eventual use in receiving locating pins of an electrical connector (not shown) in which one of the flat flexible circuits defined by circuit panel areas 30 will be mounted. Holes 40 are provided for receiving terminal pins which will be operatively associated with capacitor-type electronic components, as described hereinafter. The continuous strip of substrate 24 is provided on supply reel 10 with conductive circuit material 42 deposited thereon at selected locations. Lastly, codes 43 and 44 are provided on at least one of the carrier strips 34 adjacent each circuit panel area 30. These codes may be mechanical (e.g. holes) or it may be optical, such as the circle and the bar code shown. The codes are provided to be optically read and interpreted by a microprocessor at one or more of the work stations to direct equipment or machinery at the work stations to perform their specific processes.

Before proceeding with the precise steps of the method of the present invention, it should be emphatically understood that the particular configuration of the flat flexible circuits described herein are representative or exemplary only. In other words, each circuit panel area 30 could include a wide variety of hole locations, conductive circuit configurations, electronic components and the like, depending upon the circuitry to be provided by the ultimate flexible circuit. The fabrication of a filter circuit, as described herein, is but one of many circuit configurations with which the inventive method is applicable.

Therefore, referring back to FIG. 1, the flat flexible substrate 24, described above, is fed off of supply reel 10 in the direction of arrow "A" to the first work station 18. At this work station, solder paste is applied to appropriate areas of the conductive circuit material 42 deposited on the substrate (conductive epoxy may be used in place of solder paste). The continuous strip of substrate is fed in the direction of arrow "B" to main work station 14 wherein insertion machine 16 inserts electronic components onto or into the substrate. In the illustrated embodiment, as seen particularly in FIG. 3, the electronic components are capacitors 50 having conductive opposite ends connectable to spaced portions of the conductive circuit material deposited on substrate 24. An example of such electronic components and this type of flexible filter circuitry is shown in the aforementioned U.S. Pat. No. 5,141,455 which is incorporated herein by reference.

After electronic components 50 are mounted on continuous substrate strip 24, the strip, with the electronic components mounted thereon, is fed in the direction of arrow "C" to work station 20 (FIG. 1) wherein the solder paste is reflowed in a known process to electrically connect capacitors 50 to the conductive circuit material on the substrate. From work station 20, the continuous strip of substrate 24 is fed in the direction of arrow "D" to work station 22 whereat the circuitry is tested for viability, proper connections and the like.

After the circuitry is tested at work station 22, the continuous strip of substrate 24, with the electronic components 50 mounted thereon, is fed in the direction of arrow "E" to take-up reel 12 whereat the substrate, with the electronic components mounted thereon, is wound onto the reel for storage, subsequent processing and ultimate use of the flat flexible circuits fabricated by the method described.

In particular, it can be understood that the invention contemplates that take-up reel 12 has a continuous strip of fully completed and processed flat flexible circuit panels thereon which can be used simply by separating the panels at webs 32 and 36 (FIG. 3). It can be seen from the inventive method that separate or discrete panels of flat flexible circuitry are not handled in any way prior to winding the completed but joined flexible circuits onto reel 12. The entire reel of joined flexible circuits can be shipped to a customer without separating the circuits into individual, difficult-to-handle components. Even if a customer wishes to be supplied with discrete flexible circuits, the circuits can be cut prior to shipment, while the circuits still were fabricated in a continuous method saving considerable manufacturing costs.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A method of fabricating flat flexible circuits which include a flat flexible insulating substrate having conductive circuit material thereon and electronic components mounted on the substrate, comprising the steps of:

providing a continuous strip of said substrate;

moving the strip to a work station wherein said continuous strip of said substrate is provided with a code on said continuous strip for reading at said work station said code containing instructions for performing work at said work stations and whereat said electronic components are mounted thereon; and winding the strip, with the electronic components mounted thereon, onto a reel for subsequent processing.

2. The method of claim 1 wherein said continuous strip of said substrate, with the electronic components mounted thereon, is moved directly from said work station onto said reel.

3. The method of claim 1 wherein said substrate has conductive material on at least one side thereof, and at least some of said electronic components comprise capacitors, and wherein said method includes mounting the capacitors on the substrate coupled to said conductive material.

4. The method of claim 1 wherein said continuous strip of said substrate is provided with the conductive circuit material thereon.

5. The method of claim 1 wherein said continuous strip of said substrate is provided with cuts to divide the strip into discrete circuit panel areas seriatim along the length of the strip.

6. The method of claim 5 wherein said continuous strip of said substrate is provided with at least one carrier strip lengthwise thereof and to which the discrete circuit panel areas are removably attached by web portions of the continuous strip of said substrate.

7. The method of claim 6 wherein said continuous strip of said substrate is provided with a code on said carrier strip for reading at said work station said code containing instructions for performing work at said work station.

8. The method of claim 5 wherein said continuous strip of said substrate is provided with the conductive circuit on at least said circuit panel areas.

9. The method of claim 1 wherein solder paste is applied to at least selected portions of the conductive circuit material prior to moving the strip to said work station.

10. The method of claim 9 wherein said work station mounts the electronic components in contact with the solder paste, and the strip is fed from said work station to a subsequent work station whereat the solder paste is reflowed to electrically connect the electronic components to the substrate.

11. The method of claim 1 wherein said conductive circuit material includes a plurality of conductive circuit located seriatim along the length of the continuous strip of said substrate.

12. A method of fabricating flat flexible circuits which include a flat flexible insulating substrate having conductive circuit material thereon and electronic components mounted on the substrate, comprising the steps of:

providing a continuous strip of said substrate;

providing a code directly on said continuous strip of said substrate;

moving the strip to a work station for performing an operation thereon and whereat the code is readable at said work station, and winding the strip, with the electronic components mounted thereon, onto a reel for subsequent processing.

13. The method of claim 12 wherein said continuous strip of said substrate is provided with a plurality of circuit panel areas joined to a continuous carrier strip, and said code is provided on the carrier strip for reading at the work station.

* * * * *